(12) United States Patent
Kuramori (10) Patent No.: US 8,462,567 B2
(45) Date of Patent: Jun. 11, 2013

(54) ASYNCHRONOUS SEMICONDUCTOR MEMORY CAPABLE OF PREVENTING COUPLING NOISE

(75) Inventor: Bunsho Kuramori, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 145 days.

(21) Appl. No.: 13/186,921

(22) Filed: Jul. 20, 2011

(65) Prior Publication Data

US 2012/0020174 A1  Jan. 26, 2012

(30) Foreign Application Priority Data

Jul. 23, 2010  (JP) .................................. 2010-166224

(51) Int. Cl.
 *G11C 7/00*  (2006.01)
(52) U.S. Cl.
 USPC ................... 365/194; 365/230.06; 365/233.5
(58) Field of Classification Search
 USPC .................................. 365/194, 230.06, 233.5
 See application file for complete search history.

(56) References Cited

U.S. PATENT DOCUMENTS

| 5,414,659 | A | * | 5/1995 | Ito ................................... 365/200 |
| 5,784,327 | A | * | 7/1998 | Hazani ...................... 365/189.03 |
| 5,844,849 | A | * | 12/1998 | Furutani ....................... 365/194 |
| 6,452,859 | B1 | * | 9/2002 | Shimano et al. .......... 365/230.06 |
| 2003/0123297 | A1 | * | 7/2003 | Ohshima et al. .......... 365/189.05 |
| 2005/0024932 | A1 | * | 2/2005 | Ohshima et al. .............. 365/158 |

FOREIGN PATENT DOCUMENTS

JP  2003-085970 A  3/2003

* cited by examiner

*Primary Examiner* — Tuan T. Nguyen
(74) *Attorney, Agent, or Firm* — Studebaker & Brackett PC (57) ABSTRACT

A semiconductor memory which is capable of performing data reading without a faulty operation irrespective of the span of an address skew period. In detecting whether an address transition has been made and precharging a bit line formed in a memory cell array when a certain delay period has elapsed after the address transition is detected, the delay period is adjusted based on a delay period extension signal.

8 Claims, 5 Drawing Sheets

FIG. 5

ASYNCHRONOUS SEMICONDUCTOR MEMORY CAPABLE OF PREVENTING COUPLING NOISE

BACKGROUND OF THE INVENTION

1. Field of the Invention

The present invention relates to a semiconductor memory, and more particularly to a semiconductor memory in which a bit line of a memory cell is precharged in a data read operation.

2. Description of the Related Art

An asynchronous semiconductor memory has been known in which a bit line of a memory cell begins to be precharged when a transition to a next address is detected, and data is read after the precharging is completed (see FIG. 1 of Japanese Patent Kokai No. 2003-85970 (Patent Literature 1) as an example). In this semiconductor memory, an address transition detection (ATD) circuit detects whether a transition to a next address has been made, and generates an address change detection signal ATD as a result of the detection. A precharge enable signal PE is generated based on the address change detection signal ATD, and precharging is performed with respect to a bit line of a memory cell corresponding to the next address in response to the precharge enable signal PE (see FIGS. 1 and 3 of Patent Literature 1 as an example).

Here, when the transition to the next address is made, a period in which addresses change and are thus unsettled (referred to hereinafter as an "address skew period") is present immediately before the "next address" is reached, by the influence of an address skew. As a result, if the address skew period is relatively long, in response to the precharge enable signal PE, precharging is sequentially carried out with respect to respective bit lines corresponding to a group of unsettled addresses appearing in the address skew period and, successively, precharging to be originally carried out is performed with respect to the bit line corresponding to the "next address". At this time, provided that one adjacent to the bit line corresponding to the "next address" is present among the respective bit lines corresponding to the group of unsettled addresses, coupling noise may accompany a cell recovery operation through the bit lines corresponding to the unsettled addresses, resulting in there being a concern that erroneous data reading could be carried out.

Therefore, in the case where the aforementioned semiconductor memory is employed as a random access memory (RAM) to be used in a board in which an information processing system is constructed, an address skew period allowed in the board needs to be equal to or shorter than an address skew period specified in the semiconductor memory. That is, provided that the address skew period allowed in the board is longer than the address skew period specified in the semiconductor memory, there may be a concern that erroneous data reading could be carried out, resulting in a problem that this semiconductor memory may not be equipped on the board.

SUMMARY OF THE INVENTION

Therefore, the present invention has been made in view of the above problems, and it is an object of the present invention to provide a semiconductor memory which is capable of performing data reading without a faulty operation irrespective of the span of a skew period of an address supplied thereto.

In accordance with the present invention, the above and other objects can be accomplished by the provision of a semiconductor memory including a memory cell array having a plurality of memory cells formed respectively at intersections of a plurality of bit lines and a plurality of word lines, and a bit line driver for driving the bit lines, the semiconductor memory further including an address transition detecting part for detecting whether a transition from an address indicated by address data has been made, and a driving command signal generating part for supplying a driving command signal to execute driving of a selected one of the bit lines to the bit line driver when a certain delay period has elapsed after the address transition is detected, wherein the driving command signal generating part adjusts the delay period based on a delay period extension signal.

Thus, a semiconductor memory according to the present invention is configured to, in driving (precharging) a bit line formed in a memory cell array when a certain delay period has elapsed after an address transition is detected, adjust the delay period based on an external setting through an input pad or an internal setting through a fuse device or cell fuse. As a result, in the case where the skew period of a supplied address is long, the delay period is extended, thereby preventing driving (precharging) from being carried out with respect to bit lines corresponding to unsettled addresses in the address skew period and allowing driving (precharging) to be carried out with respect to only a bit line corresponding to a next address after the lapse of the address skew period. Therefore, it is possible to prevent coupling noise resulting from sequential precharging with respect to bit lines corresponding to unsettled addresses and a bit line corresponding to a next address, so that data reading can be accurately performed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention is configured to, in detecting whether an address transition has been made and precharging a bit line formed in a memory cell array when a certain delay period has elapsed after the address transition is detected, adjust the delay period based on a delay period extension signal.

Now, exemplary embodiments of the present invention will be described in detail with reference to the annexed drawings.

Figure 1:
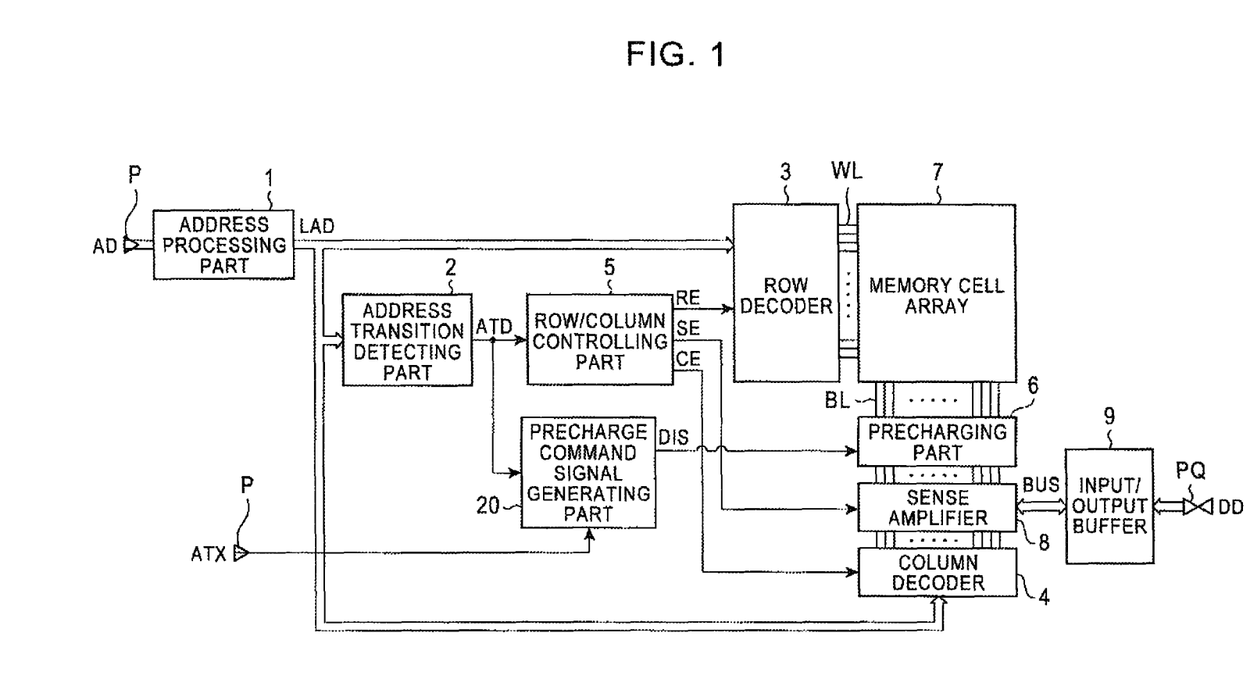
FIG. 1 is a circuit block diagram of a semiconductor memory according to the present invention.

FIG. 1 is a block diagram showing a circuit configuration provided in a semiconductor memory according to the present invention.

In FIG. 1, an address processing part 1 receives n-bit (where n is an integer which is 2 or more) address data AD externally supplied through an input pad P of the semiconductor memory and supplies the received address data AD as internal address data LAD to an address transition detecting part 2, a row decoder 3 and a column decoder 4.

The address transition detecting part 2 detects whether a transition from an address indicated by the n-bit internal address data LAD to a different address has been made, generates an address transition detection signal ATD having a pulse waveform of a logic level 1 upon detecting that the transition has been made, and supplies the generated address transition detection signal ATD to a row/column controlling part 5 and a precharge command signal generating part 20.

The row/column controlling part 5 generates a row enable signal RE to activate a word line WL of a memory cell array 7 to be described later, based on the address transition detection signal ATD, and supplies the generated row enable signal RE to the row decoder 3. The row/column controlling part 5 also generates a column enable signal CE to activate a bit line BL of the memory cell array 7, based on the address transition detection signal ATD, and supplies the generated column enable signal CE to the column decoder 4. Furthermore, the row/column controlling part 5 generates a sense amplifier enable signal SE to activate a sense amplifier 8 to be described later, based on the address transition detection signal ATD, and supplies the generated sense amplifier enable signal SE to the sense amplifier 8. The row decoder 3 acquires a word line corresponding to the address indicated by the internal address data LAD in response to the row enable signal RE and supplies a word line drive signal to activate the acquired word line to the memory cell array 7.

The memory cell array 7 includes a plurality of word lines WL formed to extend in a row direction, a plurality of bit lines BL formed to extend in a column direction, and a plurality of memory cells, each having, for example, one transistor and one capacitor, arranged respectively at intersections of the word lines WL and the bit lines BL. The column decoder 4 acquires a bit line specified by the internal address data LAD in response to the column enable signal CE and supplies a column selection signal to select the acquired bit line to the memory cell array 7.

The precharge command signal generating part 20 generates a precharge command signal DIS having a pulse waveform delayed by a certain delay period from an address transition detection time based on the address transition detection signal ATD in response to the address transition detection signal ATD and supplies the generated precharge command signal DIS to a precharging part 6. Also, the precharge command signal generating part 20 extends the delay period based on a delay period extension signal ATX externally set through the input pad P.

The precharging part 6 precharges a bit line BL of the memory cell array 7 to a predetermined voltage level in response to the precharge command signal DIS. At this time, the bit line BL selected by the column selection signal is precharged.

The sense amplifier 8 senses/amplifies the voltage level of the bit line BL selected by the column selection signal among the plurality of bit lines BL formed in the memory cell array 7 in response to the sense amplifier enable signal SE and sends the resulting voltage signal onto a data bus BUS. As a result, the sense amplifier 8 reads data written in each of the memory cells connected to the word line activated according to the row enable signal RE out onto the data bus BUS. Also, the sense amplifier 8 writes data sent to the data bus BUS through an input/output buffer 9 to be described below into the memory cell array 7 via the selected bit line BL. The input/output buffer 9 receives m-bit (where m is an integer which is 2 or more) data DD externally supplied through an input/output pad PQ and supplies the received data DD to the sense amplifier 8 over the data bus BUS. Also, the input/output buffer 9 sends data on the data bus BUS, read out from the memory cell array 7 through the sense amplifier 8, as data DD externally through the input/output pad PQ.

By the above-stated configuration, in the semiconductor memory shown in FIG. 1, externally supplied data DD is written into a memory cell in the memory cell array 7 belonging to the address indicated by the address data AD through the input/output buffer 9, sense amplifier 8 and bit line BL. Also, data stored in the memory cell in the memory cell array 7 belonging to the address indicated by the address data AD is read out through the bit line BL, sense amplifier 8 and input/output buffer 9.

Next, a description will be given of a start timing of precharging which is carried out at every change of the address indicated by the address data AD to a next address in a data read operation of this semiconductor memory.

Figure 2:
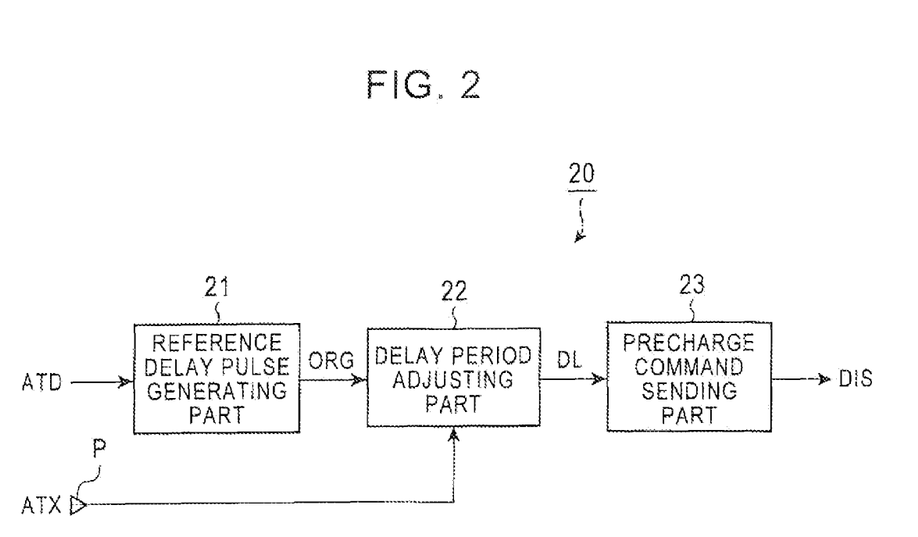
FIG. 2 is a block diagram showing an embodiment of an internal configuration of a precharge command signal generating part 20.

FIG. 2 is a block diagram showing an embodiment of an internal configuration of the precharge command signal generating part 20, which generates the precharge command signal DIS to execute precharging.

Figure 3:
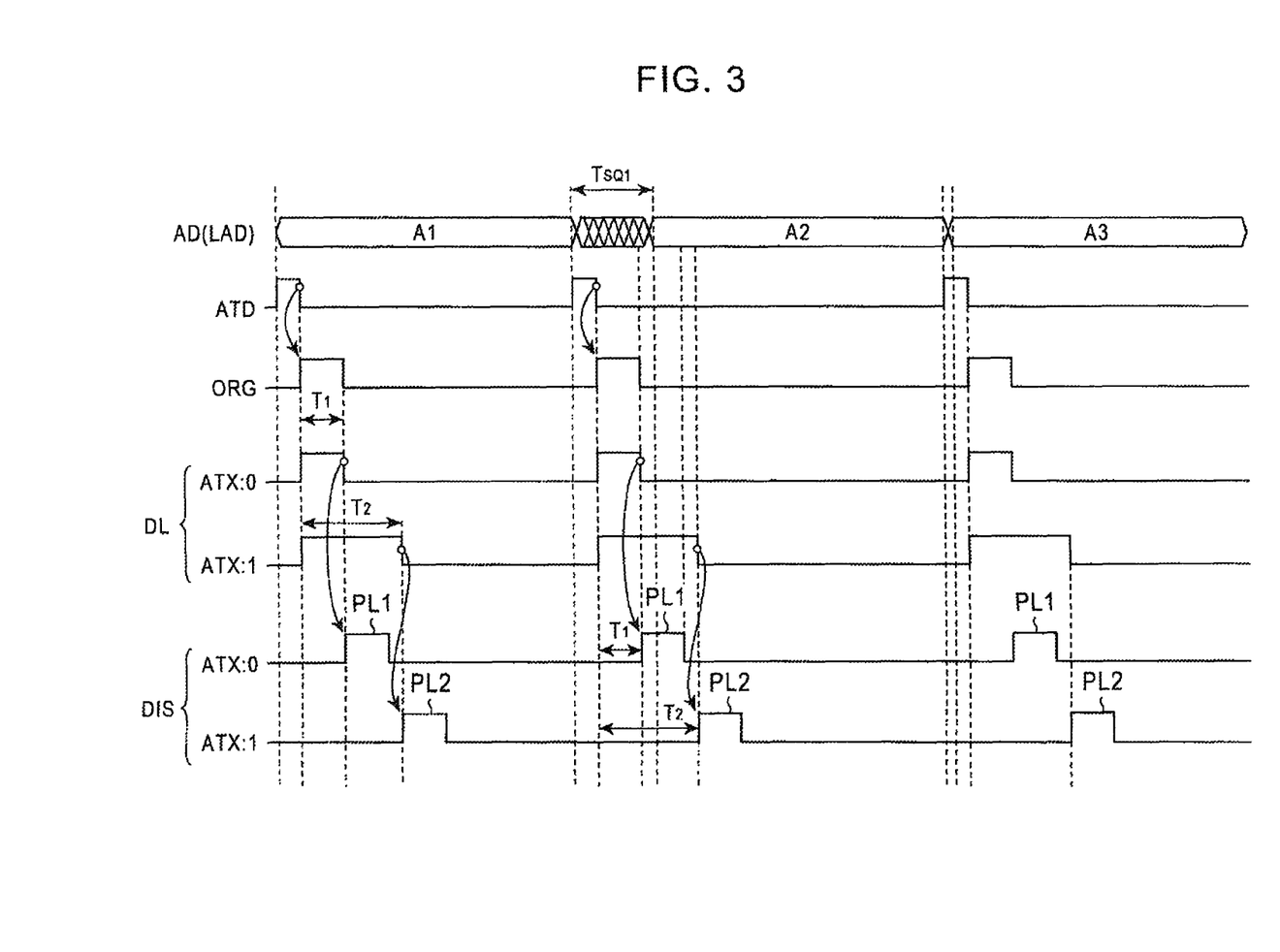
FIG. 3 is a timing diagram illustrating an internal operation of the precharge command signal generating part 20.

In FIG. 2, a reference delay pulse generating part 21 generates a pulse having a pulse width equal to a predetermined reference delay period T1 based on the address transition detection signal ATD and supplies the generated pulse as a reference delay pulse signal ORG to a delay period adjusting part 22, as shown in FIG. 3.

In the case where the delay period extension signal ATX supplied to the delay period adjusting part 22 has a logic level 0 indicative of non-extension of a delay period from an address transition detection time to a precharge execution timing, the delay period adjusting part 22 supplies the reference delay pulse signal ORG consisting of a train of pulses each having the pulse width equal to the reference delay period T1 directly as a delay pulse signal DL to a precharge command sending part 23, as shown in FIG. 3. On the other hand, in the case where the delay period extension signal ATX has a logic level 1 indicative of extension of the delay period, the delay period adjusting part 22 extends the pulse width of each pulse of the reference delay pulse signal ORG to an extended delay period T2 longer than the reference delay period T1 and supplies the resulting pulse signal as the delay pulse signal DL to the precharge command sending part 23. That is, the delay period adjusting part 22 adjusts the delay period from the address transition detection time to the precharge execution timing to two steps, the reference delay period T1 and the extended delay period T2 longer than the reference delay period T1, in response to the delay period extension signal ATX.

The precharge command sending part 23 generates a pulse having a predetermined pulse width with timing of a trailing edge of each pulse of the delay pulse signal DL and supplies the generated pulse as the precharge command signal DIS to the precharging part 6. That is, in the case where the delay period extension signal ATX has the logic level 0, the precharge command sending part 23 generates a pulse PL1 with timing delayed by the reference delay period T1 from the address transition detection time based on the address transition detection signal ATD and supplies the precharge command signal DIS consisting of the generated pulse PL1 to the precharging part 6, as shown in FIG. 3. On the other hand, in the case where the delay period extension signal ATX has the logic level 1, the precharge command sending part 23 generates a pulse PL2 as shown in FIG. 3 with timing delayed by the extended delay period T2 from the address transition detection time based on the address transition detection signal ATD and supplies the precharge command signal DIS consisting of the generated pulse PL2 to the precharging part 6.

With this configuration, when the delay period extension signal ATX externally set through the input pad P indicates the non-extension of the delay period, the precharge command signal generating part 20 generates the precharge command signal DIS having the pulse PL1 delayed by the reference delay period T1 from the address transition detection time, as shown in FIG. 3. On the other hand, when the delay period extension signal ATX indicates the extension of the delay period, the precharge command signal generating part 20 generates the precharge command signal DIS having the pulse PL2 delayed by the extended delay period T2 longer than the reference delay period T1 from the address transition detection time. The precharging part 6 performs precharging with respect to a bit line BL corresponding to address data AD supplied at a supply time of the pulse PL1 or PL2 of the precharge command signal DIS as shown in FIG. 3 over a supply period of the pulse PL1 or PL2.

In other words, the precharge command signal generating part 20 is configured to, in generating the precharge command signal DIS to precharge a bit line BL when a certain delay period has elapsed from the address transition detection time, adjust the delay period based on the delay period extension signal ATX.

Notably, in the case where an address skew period of the address data AD is long, there is a concern that coupling noise as stated previously could be generated if precharging is performed with the precharge command signal DIS having the pulse PL1 delayed by the reference delay period T1 from the address transition detection time, as shown in FIG. 3.

For example, it is assumed that the delay period extension signal ATX of the logic level 0 indicative of the non-extension of the delay period is externally set in the case where the present semiconductor memory is employed as a RAM of a board in which a relatively long address skew period $T_{SQ1}$ occurs when the address data AD makes a transition from "A1" to "A2", as shown in FIG. 3. In response to this delay period extension signal ATX of the logic level 0, precharging is carried out with the precharge command signal DIS having the pulse PL1 as shown in FIG. 3. At this time, the pulse PL1 in the precharge command signal DIS ranges from the address skew period $T_{SQ1}$ to a time at which the address data AD is in the state of "A2", as shown in FIG. 3. As a result, precharging is first sequentially carried out with respect to respective bit lines BL corresponding to a group of unsettled addresses changing and appearing in the address skew period $T_{SQ1}$ and, successively, with respect to a bit line BL corresponding to the address "A2". At this time, provided that one adjacent to the bit line BL corresponding to the address "A2" is present among the respective bit lines BL corresponding to the group of unsettled addresses, coupling noise may accompany a cell recovery operation through the bit lines BL corresponding to the unsettled addresses, resulting in there being a concern that erroneous data reading could be carried out.

In order to avoid this problem, the delay period extension signal ATX of the logic level 1 indicative of the extension of the delay period from the address transition detection time to the precharge execution timing is supplied through the input pad. For example, a first voltage corresponding to the logic level 1 may be fixedly supplied to the input pad P for the delay period extension signal ATX. At this time, the precharge command sending part 23 supplies the precharge command signal DIS having the pulse PL2 delayed by the extended delay period T2 longer than the reference delay period T1 from the address transition detection time to the precharging part 6. As a result, the pulse PL2 appears in the precharge command signal DIS after the address data AD makes a complete transition to the state of "A2", as shown in FIG. 3, thereby preventing precharging from being carried out with respect to bit lines corresponding to unsettled addresses in the address skew period and allowing precharging to be carried out with respect to only the bit line BL corresponding to the address "A2". Therefore, it is possible to prevent coupling noise resulting from sequential precharging with respect to bit lines corresponding to unsettled addresses and a bit line corresponding to a next address, so that data reading can be accurately performed.

On the other hand, in the case where the present semiconductor memory is employed as a RAM of a board in which the address skew period of the address data AD is short, there is no concern that the above problem could occur. In this case, in order to execute precharging based on the precharge command signal DIS having the pulse PL1 delayed by the reference delay period T1 from the address transition detection time, the delay period extension signal ATX of the logic level 0 indicative of the non-extension of the delay period is externally supplied. For example, a voltage corresponding to the logic level 0 may be fixedly applied to the input pad P for the delay period extension signal ATX. Accordingly, it is possible to promote shortening of an address access time.

As described above, the semiconductor memory of the above embodiment can perform data reading without a faulty operation by virtue of an external setting through the input pad even if it is equipped on a board in which an information processing system having a long address skew period is constructed, as well as on a board in which an information processing system having a short address skew period is constructed.

The above embodiment has been described to set whether to extend the delay period from the address transition detection time to the precharge execution timing, by means of the delay period extension signal ATX set through the input pad P of the semiconductor memory. Alternatively, the setting as to whether to extend the delay period may be performed by a fuse device provided in the semiconductor memory.

Figure 4:
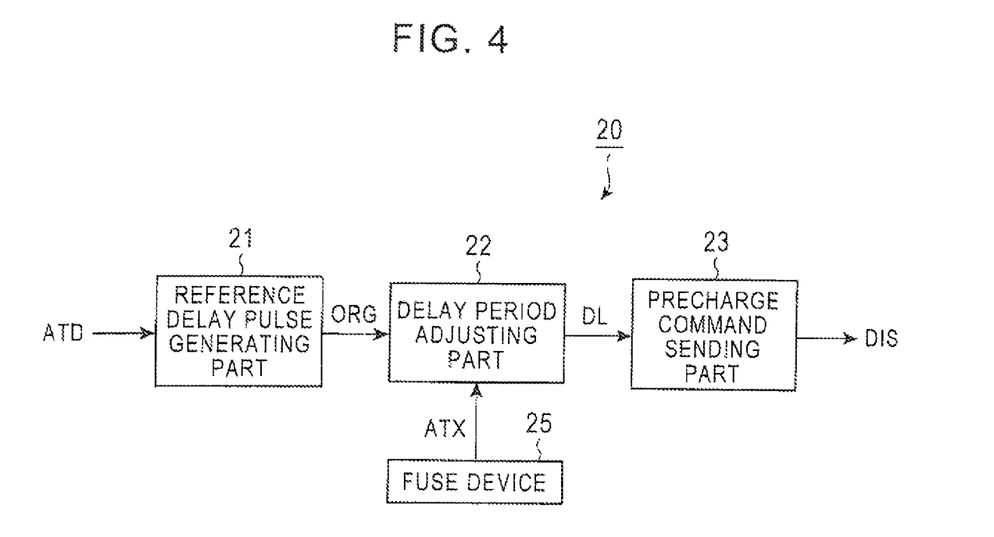
FIG. 4 is a block diagram showing another embodiment of the internal configuration of the precharge command signal generating part 20.

FIG. 4 is a block diagram showing another embodiment of the internal configuration of the precharge command signal generating part 20, which is made in view of the above alternative.

The configuration of the precharge command signal generating part 20 shown in FIG. 4 is the same as that shown in FIG. 2, with the exception that a fuse device 25 is newly provided. Here, the input pad P for externally inputting the delay period extension signal ATX is not necessary.

Hereinafter, the operation of the precharge command signal generating part 20 shown in FIG. 4 will be described centering on the operation of the fuse device 25.

For example, in the case where a fuse of the fuse device 25 is not cut, the fuse device 25 may supply the delay period extension signal ATX having a predetermined low voltage indicative of the non-extension of the delay period to the delay period adjusting part 22. On the other hand, in the case where the fuse is cut, the fuse device 25 may supply the delay period extension signal ATX having a predetermined high voltage indicative of the extension of the delay period to the delay period adjusting part 22.

Accordingly, the precharge command signal generating part 20 with the configuration shown in FIG. 4, when the predetermined low voltage is supplied from the fuse device 25, generates the precharge command signal DIS having the pulse PL1 delayed by the reference delay period T1 from the address transition detection time. On the other hand, when the predetermined high voltage is supplied from the fuse device 25, the precharge command signal generating part 20 generates the precharge command signal DIS having the pulse PL2 delayed by the extended delay period T2 (T1<T2) from the address transition detection time.

That is, in the case where the semiconductor memory having the precharge command signal generating part 20 shown in FIG. 4 is equipped on a board in which an information processing system having a long address skew period is constructed, the fuse of the fuse device 25 is cut in advance. On the other hand, in the case where the semiconductor memory having the precharge command signal generating part 20 shown in FIG. 4 is equipped on a board in which an information processing system having a short address skew period is constructed, the fuse of the fuse device 25 is used as it is without being cut.

By adopting this configuration, there is no need for the input pad to externally set whether to extend the delay period from the address transition detection time to the precharge execution timing and, in turn, for a wire bonding process for the input pad. Therefore, it is possible to curtail a manufacturing cost compared to the case of adopting the configuration shown in FIG. 2.

As another alternative, a memory cell fuse may be used instead of the fuse device 25.

Figure 5:
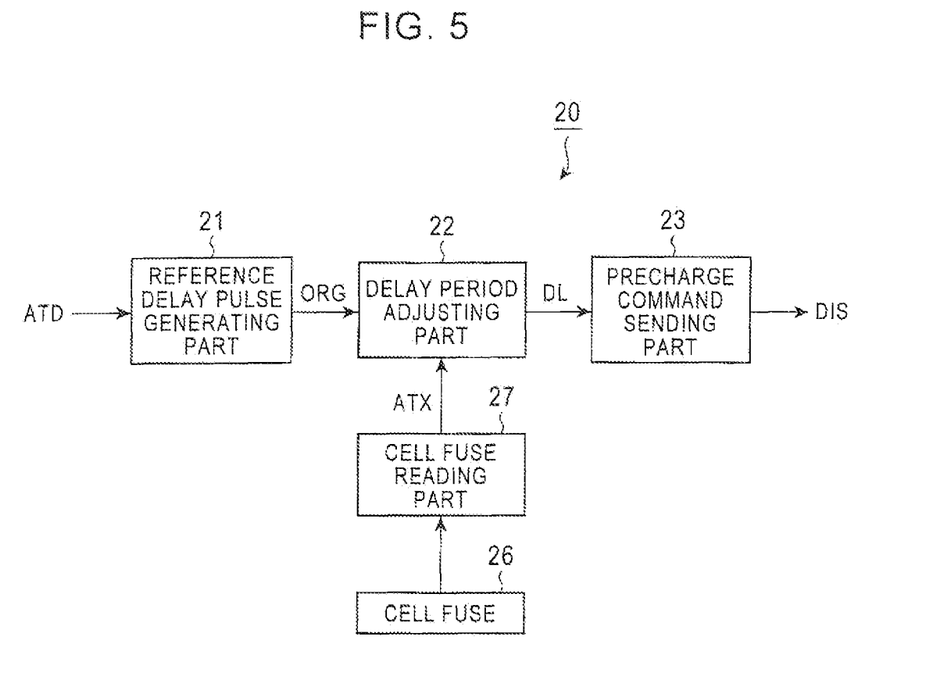
FIG. 5 is a block diagram showing another embodiment of the internal configuration of the precharge command signal generating part 20.

FIG. 5 is a block diagram showing another embodiment of the internal configuration of the precharge command signal generating part 20, which is made in view of the above alternative.

The configuration of the precharge command signal generating part 20 shown in FIG. 5 is the same as that shown in FIG. 4, with the exception that a cell fuse 26 and a cell fuse reader 27 are employed instead of the fuse device 25 shown in FIG. 4. In this regard, the operation of the precharge command signal generating part 20 shown in FIG. 5 will hereinafter be described centering on the operations of the cell fuse 26 and cell fuse reader 27.

In the cell fuse 26, bit information is previously written which indicates whether to extend the delay period from the address transition detection time to the precharge execution timing. The cell fuse reader 27 reads the bit information written in the cell fuse 26, and supplies the delay period extension signal ATX having a predetermined low voltage to the delay period adjusting part 22 when the read bit information indicates the non-extension of the delay period. On the other hand, when the read bit information indicates the extension of the delay period, the cell fuse reader 27 supplies the delay period extension signal ATX having a predetermined high voltage to the delay period adjusting part 22.

In other words, in the case where the semiconductor memory having the precharge command signal generating part 20 shown in FIG. 5 is equipped on a board in which an information processing system having a short address skew period is constructed, bit information of, for example, a logic level 0 indicative of the non-extension of the delay period is previously written in the cell fuse 26. On the other hand, in the case where the semiconductor memory having the precharge command signal generating part 20 shown in FIG. 5 is equipped on a board in which an information processing system having a long address skew period is constructed, bit information of, for example, a logic level 1 indicative of the extension of the delay period is previously written in the cell fuse 26.

By adopting this configuration, there is no need for the input pad to externally set whether to extend the delay period, similarly to the case of adopting the configuration shown in FIG. 4. Therefore, it is possible to curtail a manufacturing cost compared to the case of adopting the configuration shown in FIG. 2.

Further, although the delay period adjusting part 22 has been described to adjust the delay period from the address transition detection time to the precharge execution timing to the two steps, the reference delay period T1 and the extended delay period T2, in response to the delay period extension signal ATX, it may be configured to adjust the delay period to m (where m is an integer which is 3 or more) steps of m different delay periods. In this case, the delay period extension signal ATX may be set to m values corresponding to extension levels of the delay period.

This application is based on Japanese Patent Application No. 2010-166224 which is herein incorporated by reference.

What is claimed is:

1. A semiconductor memory comprising a memory cell array having a plurality of memory cells formed respectively at intersections of a plurality of bit lines and a plurality of word lines, and a bit line driver for driving the bit lines, the semiconductor memory further comprising:
   an address transition detecting part for detecting whether a transition from an address indicated by address data has been made; and
   a driving command signal generating part for supplying a driving command signal to execute driving of a selected one of the bit lines to the bit line driver when a certain delay period has elapsed after the address transition is detected,
   wherein the driving command signal generating part adjusts the delay period based on a delay period extension signal.

2. The semiconductor memory according to claim 1, wherein the driving command signal generating part sets the delay period to a predetermined first period when the delay period extension signal indicates non-extension of the delay period, and to a second period when the delay period extension signal indicates extension of the delay period, the second period being longer than the first period.

3. The semiconductor memory according to claim 2, wherein the driving command signal generating part comprises:
   a reference delay pulse generating part for generating a reference delay pulse having a pulse width of the first period when the address transition is detected;
   a delay period adjusting part for setting the reference delay pulse as a delay pulse when the delay period extension signal indicates the non-extension of the delay period, and, when the delay period extension signal indicates the extension of the delay period, extending the pulse width of the reference delay pulse to the second period and setting the resulting pulse as the delay pulse; and
   a driving command output unit for outputting the driving command signal to execute the driving of the selected bit line with timing of a trailing edge of the delay pulse.

4. The semiconductor memory according to any one of claim 1, wherein the bit line driver comprises precharging means for precharging the selected bit line to a predetermined voltage level in response to the driving command signal.

5. The semiconductor memory according to claim 1, further comprising an input pad for externally setting the delay period extension signal.

6. The semiconductor memory according to claim 5, wherein a predetermined first voltage is fixedly supplied as the delay period extension signal to the input pad for the non-extension of the delay period, and a second voltage is fixedly supplied as the delay period extension signal to the input pad for the extension of the delay period, the second voltage being different from the first voltage.

7. The semiconductor memory according to claim 1, further comprising a fuse device,
   wherein the delay period extension signal to indicate whether to extend the delay period is generated according to whether the fuse device is cut.

8. The semiconductor memory according to claim 1, further comprising:
   a cell fuse; and
   a cell fuse reader for reading information written in the cell fuse,
   wherein information to indicate whether to extend the delay period is previously written in the cell fuse,
   wherein the cell fuse reader reads the information written in the cell fuse as the delay period extension signal.

\* \* \* \* \*